United States Patent
Liu et al.

(10) Patent No.: US 12,045,493 B2
(45) Date of Patent: Jul. 23, 2024

(54) MEMORY APPARATUS AND DATA REARRANGEMENT METHOD FOR COMPUTING IN MEMORY

(71) Applicant: Skymizer Taiwan Inc., Taipei (TW)

(72) Inventors: Shu-Ming Liu, Taipei (TW); Kai-Chiang Wu, Hsinchu (TW); Wen Li Tang, Taipei (TW)

(73) Assignee: Skymizer Taiwan Inc., Taipei (TW)

( * ) Notice: Subject to any disclaimer, the term of this patent is extended or adjusted under 35 U.S.C. 154(b) by 0 days.

(21) Appl. No.: 17/947,170

(22) Filed: Sep. 19, 2022

(65) Prior Publication Data

US 2024/0028245 A1 Jan. 25, 2024

(30) Foreign Application Priority Data

Jul. 22, 2022 (TW) .................................. 111127517

(51) Int. Cl.
*G06F 3/06* (2006.01)

(52) U.S. Cl.
CPC .......... *G06F 3/0653* (2013.01); *G06F 3/0619* (2013.01); *G06F 3/0679* (2013.01)

(58) Field of Classification Search
None
See application file for complete search history.

(56) References Cited

U.S. PATENT DOCUMENTS

| | | | | |
|---|---|---|---|---|
| 11,568,200 | B2* | 1/2023 | Hoang | G06F 17/15 |
| 11,594,277 | B2* | 2/2023 | Ho | G11C 11/4094 |
| 2010/0125772 | A1* | 5/2010 | Cheng | G06F 11/1068 |
| | | | | 714/E11.034 |
| 2021/0158133 | A1* | 5/2021 | Park | G06N 3/063 |
| 2021/0287076 | A1* | 9/2021 | Li | G06N 3/044 |
| 2021/0397366 | A1* | 12/2021 | Lee | G06F 3/0619 |
| 2023/0045840 | A1* | 2/2023 | Chih | G11C 7/1063 |
| 2023/0155718 | A1* | 5/2023 | Liu | H04L 1/0008 |
| | | | | 370/464 |

* cited by examiner

*Primary Examiner* — Sanjiv Shah
*Assistant Examiner* — Elias Young Kim
(74) *Attorney, Agent, or Firm* — JCIPRNET

(57) ABSTRACT

A memory apparatus and a data rearrangement method for computing in memory (CIM) are provided. The method includes determining whether first sequence data has two target bits that are both of a first value, inserting a non-target bit of a second value between the two target bits that are both of the first value and adjacent to each other to generate second sequence data, and receiving the second sequence data through memory cells in a memory to perform a multiply-accumulate (MAC) operation on the second sequence data. Each bit in the first sequence data is the first value or the second value. One of the two target bits is located adjacent to the other one of the two target bits in the first sequence data. The two target bits and the non-target bit are located in the first sequence data. Accordingly, the error rate is decreased.

6 Claims, 3 Drawing Sheets

MEMORY APPARATUS AND DATA REARRANGEMENT METHOD FOR COMPUTING IN MEMORY

CROSS-REFERENCE TO RELATED APPLICATION

This application claims the priority benefit of Taiwan application serial no. 111127517, filed on Jul. 22, 2022. The entirety of the above-mentioned patent application is hereby incorporated by reference herein and made a part of this specification.

BACKGROUND

Technical Field

The present disclosure relates to a data processing mechanism, and more particularly, to a memory apparatus and a data rearrangement method for computing in memory (CIM).

Description of Related Art

Neural network is an important theme in artificial intelligence (AI), which makes decisions by simulating an operation of human brain cells. It is worth noting that there are many neurons in the human brain cells, and these neurons are connected to each other through synapse. Each of the neurons can receive signals by the synapse, and a converted output of the signal will be transmitted to another neuron. The conversion ability of each of the neurons is different, and through operations of the aforementioned signal transmission and conversion, human beings can form an ability to think and judge. The neural network obtains the corresponding ability according to the aforementioned operation method.

The neural network is often used in image recognition, speech recognition or data analysis. In the operation of each of the neurons, an input component is multiplied by a weight of the corresponding synapse (possibly with a bias) and then output through a computation of a nonlinear function (e.g. activation function) to extract features. Inevitably, a memory for storing input values, weight values, and function parameters may cause failures/damages in some memory blocks (e.g. hard errors) due to poor yield, or other factors of CIM (e.g. unstable cell resistance, operation unit (OU) size or non-ideal current-sensing) may cause output errors, which in turn affects completeness or correctness of stored data. Although a CIM architecture improves processing efficiency and power consumption, the CIM architecture may be followed by a certain error rate.

SUMMARY

An embodiment of the present disclosure provides a memory apparatus and a data rearrangement method for CIM, which reduces an error rate of a CIM architecture.

The data rearrangement method for CIM of the embodiment of the present disclosure includes (but is not limited to): determining whether first sequence data has two target bits that are both of a first value, inserting a non-target bit of a second value between the two target bits that are both of the first value and adjacent to each other to generate second sequence data, and receiving the second sequence data through memory cells in a memory to perform a multiply-accumulate (MAC) operation on the second sequence data. Each bit in the first sequence data is one of the first value and the second value, and one of the two target bits is located adjacent to the other one of the two target bits in the first sequence data. The two target bits and the non-target bit are located in the first sequence data.

The memory apparatus of the embodiment of the present disclosure includes (but is not limited to) a memory and a controller. The controller is coupled to the memory. The controller is configured to determine whether first sequence data has two target bits that are both of a first value, insert a non-target bit of a second value between the two target bits that are both of the first value and adjacent to each other to generate second sequence data, and receive the second sequence data through memory cells in the memory to perform a MAC operation on the second sequence data. Each bit in the first sequence data is one of the first value and the second value, and one of the two target bits is located adjacent to the other one of two target bits in the first sequence data. The two target bits and the non-target bit are located in the first sequence data.

Based on the above, according to the memory apparatus and the data rearrangement method for CIM of the embodiment of the present disclosure, the non-target bit is inserted between the adjacent two target bits, so that the locations of the target bits of the same first value are not contiguous in the second sequence data. Since storage of the first value in adjacent memory cells is prone to errors, the first value and the second value are arranged in a staggered arrangement to reduce the error rate.

In order to make the above-mentioned and other features and advantages of the present disclosure more obvious and easier to understand, specific embodiments are given and described in detail with the accompanying drawings as follows.

DESCRIPTION OF THE EMBODIMENTS

Figure 1:
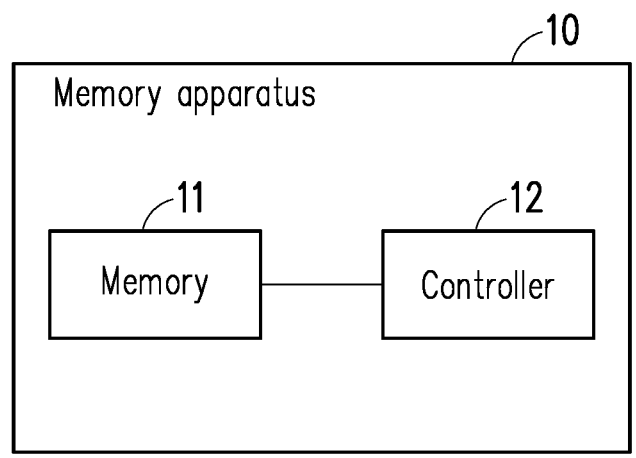
FIG. 1 is a block diagram of components of a memory apparatus according to an embodiment of the present disclosure.

FIG. 1 is a block diagram of components of a memory apparatus 10 according to an embodiment of the present disclosure. Referring to FIG. 1, the memory apparatus 10 includes (but is not limited to) a memory 11 and a controller 12. In an embodiment, the memory apparatus can be applied to an operation related to a neural network. For example, the memory apparatus 10 is a neural network accelerator.

In an embodiment, the memory 11 is a nonvolatile memory, for example, a phase change memory (PCM), a resistive RAM (ReRAM), a spin-transfer torque random-access memory (STT-RAM), or a magnetoresistive random access memory (MRAM).

In an embodiment, the memory 11 includes one or more memory cells, and the memory cells can perform operations such as AND, OR, XOR, etc. That is, CIM is realized.

Figure 2:
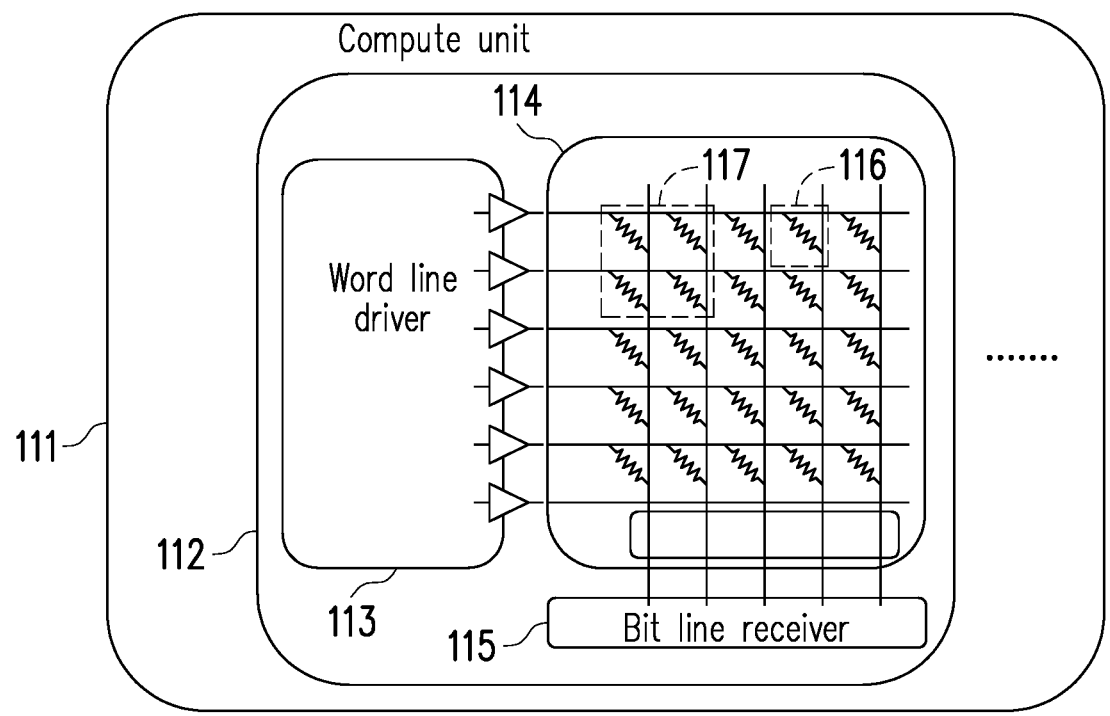
FIG. 2 is a schematic diagram of a compute unit according to an embodiment of the present disclosure.

FIG. 2 is a schematic diagram of a compute unit 111 according to an embodiment of the present disclosure. Referring to FIG. 2, taking a ReRAM as an example, the compute unit 111 includes one or more crossbar units 112. The crossbar unit 112 includes (but is not limited to) a word line driver 113, a crossbar array 114, and a bit line receiver 115. The word line driver 113 is used to receive a vector (e.g. sequence data) X (e.g. feature vector) and quantize the vector into a plurality of bits of a given length. The crossbar array 114 may serve as a resistor and is configured by a vector W (e.g. weight) and by quantized parameters. The crossbar array 114 includes one or more memory cells 116. A voltage across the bit line (BL) and the word line (WL) of the memory cells 116 is used as an input value (e.g. eigenvalues), and the weight is stored in the memory cells 116 in a vertical manner. A sum of currents of the memory cells 116 is accumulated in a capacitor, and then the voltages on several capacitors are converted into digital signals and computed, which yields a result of a MAC operation. For each cycle, the word line driver 113 electrifies the bits of the bit line of the largest OU size (e.g. defined as OU 117) to the crossbar array 114. Error model simulations sense the amplified results. The bit line receiver 115 sums and outputs the final result. Accordingly, CIM is realized.

Figure 3:
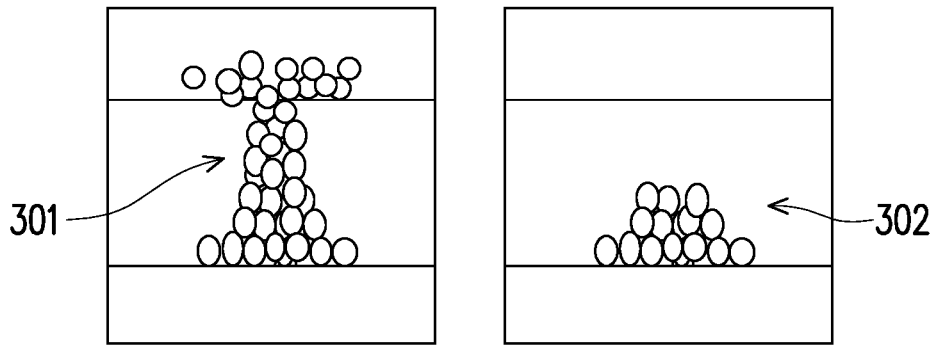
FIG. 3 is a schematic diagram of a state of memory cells according to an embodiment of the present disclosure.

FIG. 3 is a schematic diagram of a state of the memory cells 116 according to an embodiment of the present disclosure. Referring to FIG. 3, the memory cells 116 have a first state (e.g. a high resistance state (HRS)) and a second state (e.g. low resistance state (LRS)). According to voltage polarity, a conductive filament structure 301 composed of oxygen vacancies forms the first state or breaks into the second state. Oxygen vacancies refer to the vacancies formed by a detachment of oxygen atoms (oxygen ions 302) in a lattice of metal oxides or other oxygen-containing compounds, resulting in an absence of oxygen.

In some embodiments, the memory 11 may integrate static or dynamic random access memory (RAM), a read-only memory (ROM), a flash memory, a register, a combinational circuit, or a combination of the above components.

In an embodiment, the memory 11 is used for storing sequence data. The sequence data may be an image, a speech, or data of other application fields, weights used in a MAC operation related to features extraction, and/or values used in an activation operation. In an embodiment, the user can determine types of the data stored in the memory 11 according to actual needs.

The controller 12 is coupled to the memory 11. The controller 12 may be a circuit composed of one or more of a multiplexer, an adder, a multiplier, an encoder, a decoder, or various types of logic gates, and may be a central processing unit (CPU), other programmable general purpose or specific purpose microprocessors, a digital signal processor (DSP), a programmable controller, an application-specific integrated circuit (ASIC), other similar components or a combination of the above components. In an embodiment, an operation of the controller 12 may be implemented through software.

In the following, the method according to the embodiment of the present disclosure will be described with reference to the various components or circuits in the memory apparatus 10. Each process of the method can be adjusted according to the implementation situation and is not limited hereto.

Figure 4:
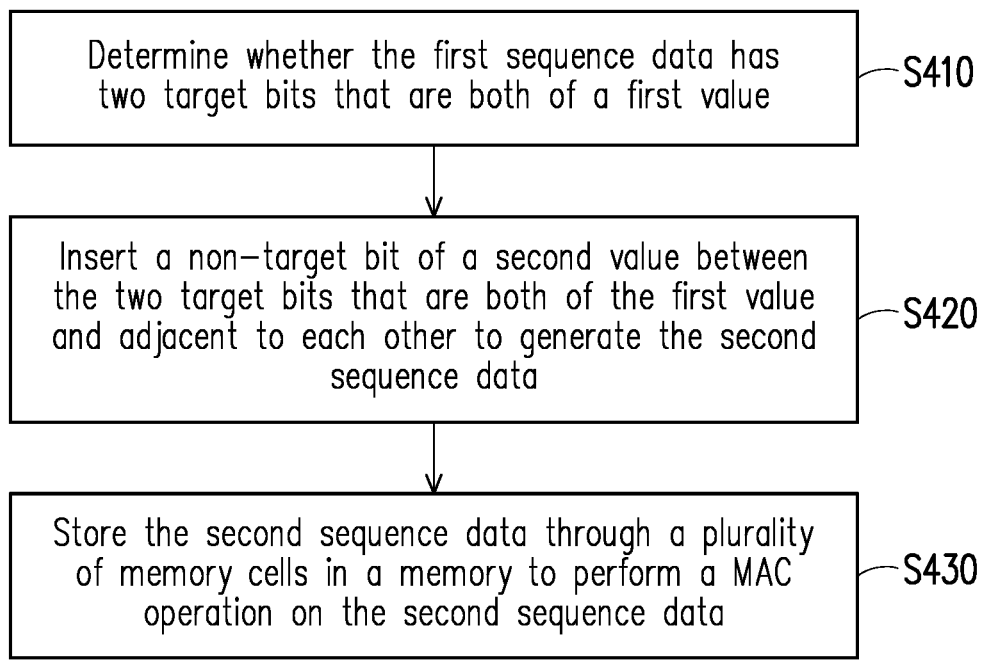
FIG. 4 is a flowchart of a data rearrangement method for CIM according to an embodiment of the present disclosure.

FIG. 4 is a flowchart of a data rearrangement method for CIM according to an embodiment of the present disclosure.

Referring to FIG. 4, the controller 12 determines whether the first sequence data has two target bits that are both of a first value (step S410). Specifically, the first, second or other sequence data is, for example, an image, a speech, sensing data or data related to other application fields (e.g. pixel grayscale values, eigenvalues, intensity values, etc.), weights used in a MAC operation or binary or other base values used in an activation operation. The values in the sequence data are ordered according to certain rules (e.g. pixel positions, convolution kernel definition positions, orders of operation, etc.). The sequence data is stored in one or more memory blocks of the memory 11 or other memories.

In an embodiment, the first sequence data includes a plurality of bits, for example, 8, 16 or 256 bits. Each of the bits in the first sequence data is one of the first value and a second value. For example, the first value is "1" and the second value is "0". As another example, the first value is "0" and the second value is "1".

In an embodiment, one of the two target bits is located adjacent to the other one of the two target bits in the first sequence data. That is to say, if an $i^{th}$ bit in the first sequence data is the first value and an $i+1^{th}$ bit or an $i-1^{th}$ bit is the first value, then the $i^{th}$ bit and the $i+1^{th}$ bit are the target bits or the $i^{th}$ bit and the $i-1^{th}$ bit are the target bits. On the other hand, the bit of the second value in the first sequence data is called a non-target bit. For example, if the first sequence data is [1 1 1 1 0 1 0 1] and the first value is "1", the target bits are the $0^{th}$ bit to the $3^{rd}$ bit, and the non-target bits are the $4^{th}$ bit and the $6^{th}$ bit. Moreover, since the adjacent bits are not of the first value, the $5^{th}$ bit and the $7^{th}$ bit, which are both of the first value, are neither the target bits nor the non-target bits, and are hereinafter collectively referred to as second non-target bits.

Referring to FIG. 4, the controller 12 inserts the non-target bit of the second value between the two target bits that are both of the first value and adjacent to each other to generate second sequence data (step S420). Specifically, the two target bits and the non-target bit are located in the first sequence data. That is to say, the first sequence data includes the two target bits and the non-target bit. The difference between the second sequence data and the first sequence data is that the non-target bit is inserted between the two target bits in the first sequence data, so that the original two target bits become the second non-target bits in the second sequence data. For example, if the first sequence data is [1 1 0 1 0 1 0 0] and the first value is "1", then the $7^{th}$ bit of the second value (that is, "0") is inserted between the $0^{th}$ bit and the $1^{st}$ bit to form the second sequence data of [1 0 1 0 1 0 1 0].

In an embodiment, after inserting the non-target bit between the original two target bits, the controller 12 may shift a bit to fill the position of the non-target bit. For example, if the $j^{th}$ bit in the first sequence data is the non-target bit and the $j-1^{th}$ bit and the $j-2^{th}$ bit are the target bits, then the non-target bit in the second sequence data is the $j-1^{th}$ bit, and the original $j-1^{th}$ target bit is changed to the second non-target bit located at the $j^{th}$ bit. However, the position of the non-target bit is not necessarily filled by shifting the bit, and other arrangements are possible.

In an embodiment, each memory cell in the memory 11 has a first state and a second state. The first state is used for storing the first value, such as the HRS shown in FIG. 3. The second state is used for storing the second value, such as the LRS shown in FIG. 3. An access error rate of the first state is higher than an access error rate of the second state. It is worth noting that factors affecting the error rate of the CIM include unstable cell resistance, OU size, or non-ideal current-sensing.

Figure 5:
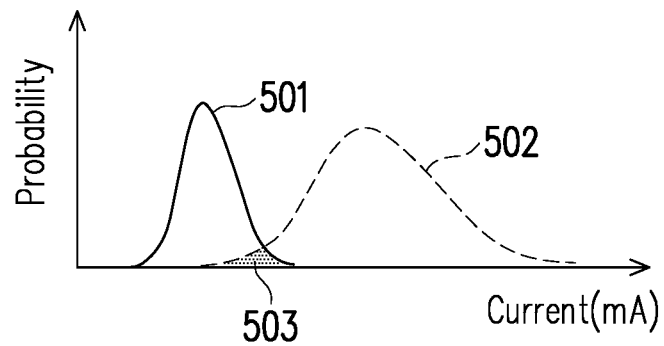
FIG. 5 is a probability distribution diagram of a current of a single cell according to an embodiment of the present disclosure.

Taking a ReRAM cell as an example, when a voltage is applied to the cell, the randomness of the conductive filament structure (such as the conductive filament structure 301 shown in FIG. 3) results in an unreliable state of the cell. The resistance histograms of the different states in the ReRAM cell may be lognormally distributed. For example, FIG. 5 is a probability distribution diagram of a current of the single cell according to an embodiment of the present disclosure. Referring to FIG. 5, a current distribution 501 is the current distribution of the first state, and a current distribution 502 is the current distribution of the second state. It is worth noting that the two current distributions 501 and 502 may have an overlapping area 503. When the overlapping area 503 exists, it is difficult to distinguish which of the first state and the second state is located in the overlapping area 503. Table (1) is an example describing the probability in the case of enabling a word line:

TABLE 1

| | Actual value | | | |
|---|---|---|---|---|
| | 0 | | 1 | |
| | Sensing value | | | |
| | 0 | 1 | 0 | 1 |
| Probability(%) | 90 | 10 | 15 | 85 |

That is to say, when the memory cell stores "0", there is a 10% chance of accessing "1", and when the memory cell stores "1", there is a 15% chance of accessing "0". Therefore, the access error rate of the state storing "1" is higher than the access error rate of the state storing "0".

It should be noted that the probability in Table (1) is only an example. Under other conditions, the access error rate of the state storing "0" may be higher than the access error rate of the state storing "1", and the embodiment of the present disclosure is not limited to the example. Moreover, device parameters (e.g. mean resistance of each state, resistance deviation) may determine the size of the overlapping area 503.

Figure 6:
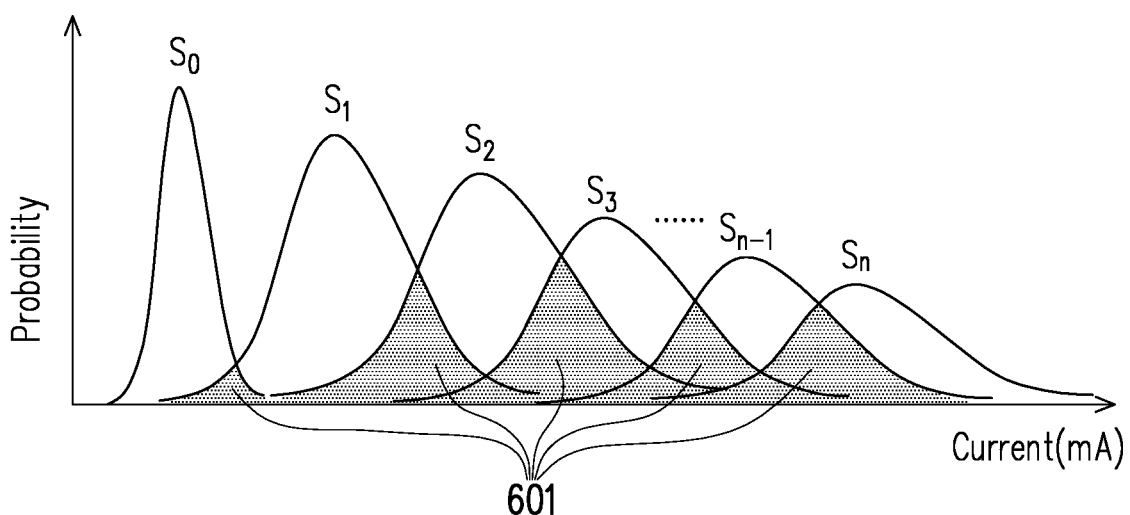
FIG. 6 is a probability distribution diagram of a current of a bit line according to an embodiment of the present disclosure.

Enabling a greater number of word lines increases the error rate when a current bias of each cell on a bit line is accumulated. FIG. 6 is a probability distribution diagram of a current of a bit line according to an embodiment of the present disclosure. Referring to FIG. 6, if n word lines are enabled, there may be current distributions $S_0 \sim S_n$ corresponding to n+1 states, where n is a positive integer. If the number n of the word lines is greater, the accumulated current increases the access error rate, in which it is difficult to distinguish the state of an overlapping area 601 between the current distributions $S_0 \sim S_n$. However, due to accuracy issues and power constraints, only a limited number of the word lines may be turned on in the crossbar array in a single cycle in the actual design. The size of the OU per cycle (that is, the number of the word lines turned on) affects the error rate. Taking Table (1) as an example, if the size of the OU is larger, the error rate increases. Therefore, it is necessary to avoid the state storing "1" in consecutive memory cells.

Moreover, a non-ideal current-sensing component (e.g. an analog-to-digital converter (ADC) or a sense amplifier (SA) in the bit line receiver) may affect the error rate. Error-related factors of the non-ideal component include bit-resolutions and sensing offsets (equal to a safety guard band sensing voltage divided by a constant related to a sensing speed of the SA).

In order to decrease the error rate, a non-target bit is inserted between adjacent target bits, so as to prevent the consecutive/adjacent memory cells from storing or calculating the first value with a high error rate.

In an embodiment, the controller 12 may determine the size of the OU in the memory 11 according to the number of the target bits in the first sequence data. The size of the OU is related to the number of the memory cells that jointly perform a dot-product operation or the number of the word lines enabled, for example, the 2×2 OU 117 shown in FIG. 2. As described above, the larger the size of the OU, the higher the error rate due to the accumulated current. The controller 12 can obtain the size of the OU corresponding to the number of the target bits according to a comparison table or a specific formula.

In an embodiment, the controller 12 may decrease the size of the OU in response to an increase in the number of the target bits in the first sequence data, for example, by decreasing the number of the word lines enabled. On the other hand, the controller 12 may increase the size of the OU in response to a decrease in the number of the target bits in the first sequence data, for example, by increasing the number of the word lines enabled. It should be noted that the aforementioned "increase" and "decrease" refer to a result of comparing the current cycle with a previous cycle or a result of comparing the current first sequence data with the previous first sequence data.

For instance, assuming that the first sequence data is [1 1 1 1] (that is, the number of the target bits is 4), the controller 12 sets the size of the OU to 2×2. Compared with outputting four "1"s at the same time, the error rate of outputting two "1"s is lower. Assuming that the next first sequence data is [1 1 1 0], the controller 12 sets the size of the OU to 3×3 (as a result of the target bits being changed from 4 to 3), and the second sequence data is [1 0 1 1] or [1 1 0 1]. Assuming that the next first sequence data is [1 0 1 0], the controller 12 sets the size of the OU to 4×4 (as a result of the target bits being changed from 3 to 2), and the second sequence data is [1 0 1 0]. It can be seen that the number of the target bits may be inversely proportional to the size of the OU.

Referring to FIG. 4, the controller 12 may receive the second sequence data through a plurality of the memory cells in the memory 11 to perform the MAC operation on the second sequence data (step S430). Specifically, the controller 12 writes the second sequence data (e.g. as weight data) into the corresponding memory cells in the memory 11 and inputs another sequence data (e.g. as feature data) into the corresponding word lines in the memory 11 to obtain a computational result of the MAC operation by sensing the current output from the SA connected to each bit line and accumulating the sensing value of the SA by a counter or an accumulator. Alternatively, the controller 12 writes another sequence data into the corresponding memory cells in the memory 11 and inputs the second sequence data into the corresponding word lines in the memory 11 to obtain the computational result of the MAC operation. Since a convolution operation in a neural network needs to use the MAC operation, application of the embodiment of the present disclosure to the neural network helps to improve prediction accuracy.

To sum up, in the memory apparatus and the data rearrangement method for CIM according to the embodiments of the present disclosure, the first sequence data that have adjacent target bits of the first value is rearranged into the second sequence data in which a non-target bit is inserted between the two first values. Moreover, through setting the size of the OU, the situation of outputting many first values at the same time can be avoided. Accordingly, the error rate is decreased and the inference accuracy of the neural network is increased.

Although the present disclosure has been described with reference to the embodiments above, they are not intended to limit the present disclosure. Those skilled in the art can make some changes and modifications without departing from the spirit and the scope of the present disclosure. The protection scope of the present disclosure shall be determined by the claims appended in the following.

What is claimed is:

1. A data rearrangement method for computing in memory (CIM), comprising:
   determining whether a first sequence data has two target bits that are both of a first value, wherein each bit in the first sequence data is one of the first value and a second value, and one of the two target bits is located adjacent to the other one of the two target bits in the first sequence data;
   inserting a non-target bit of the second value between the two target bits that are both of the first value and adjacent to each other to generate a second sequence data, wherein the two target bits and the non-target bit are located in the first sequence data;
   determining a size of an operation unit (OU) in a memory according to the number of target bits in the first sequence data, wherein the size of the operation unit is related to the number of memory cells that jointly perform a dot-product operation, and determining the size of the operation unit comprises:
   decreasing the size of the operation unit in response to an increase in the number of the target bits in the first sequence data; and
   increasing the size of the operation unit in response to a decrease in the number of the target bits in the first sequence data, wherein the increase and the decrease in the number of the target bits refer to a result of comparing the first sequence data associated with a current cycle with a previous first sequence data associated with a previous cycle; and
   receiving the second sequence data through corresponding memory cells in the memory to perform a multiply-accumulate (MAC) operation on the second sequence data.

2. The data rearrangement method for computing in memory according to claim 1, wherein each of the memory cells comprises a first state and a second state, the first state is used for storing the first value, the second state is used for storing the second value, and an access error rate of the first state is higher than an access error rate of the second state.

3. The data rearrangement method for computing in memory (CIM) according to claim 1, wherein the first value is "1", and the second value is "0".

4. A memory apparatus, comprising:
   a memory; and
   a controller coupled to the memory and configured to:
   determine whether a first sequence data has two target bits that are both of a first value, wherein each bit in the first sequence data is one of the first value and a second value, and one of the two target bits is located adjacent to the other one of the two target bits in the first sequence data;
   insert a non-target bit of the second value between the two target bits that are both of the first value and adjacent to each other to generate a second sequence data, wherein the two target bits and the non-target bit are located in the first sequence data; and
   determine a size of an operation unit (OU) in the memory according to the number of target bits in the first sequence data, wherein the size of the operation unit is related to the number of memory cells that jointly perform a dot-product operation, and the controller is further configured to:
   decrease the size of the operation unit in response to an increase in the number of the target bits in the first sequence data; and
   increase the size of the operation unit in response to a decrease in the number of the target bits in the first sequence data, wherein the increase and the decrease in the number of the target bits refer to a result of comparing the first sequence data associated with a current cycle with a previous first sequence data associated with a previous cycle, and receive the second sequence data is received through corresponding memory cells in the memory to perform a multiply-accumulate (MAC) operation on the second sequence data.

5. The memory apparatus according to claim 4, wherein each of the memory cells comprises a first state and a second state, the first state is used for storing the first value, the second state is used for storing the second value, and an access error rate of the first state is higher than an access error rate of the second state.

6. The memory apparatus according to claim 4, wherein the first value is "1", and the second value is "0".

* * * * *